United States Patent
Wichowski et al.

(10) Patent No.: US 11,199,585 B2
(45) Date of Patent: Dec. 14, 2021

(54) HIGHSPEED DATA INTERFACE FOR DISTRIBUTED SYSTEM MOTOR CONTROLLERS

(71) Applicant: Hamilton Sundstrand Corporation, Charlotte, NC (US)

(72) Inventors: Robert P. Wichowski, Westfield, MA (US); Timothy A. Roberts, Enfield, CT (US); Darren Woodman, North Granby, CT (US); Nicholas Van Derzee, Windsor, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 258 days.

(21) Appl. No.: 16/365,221

(22) Filed: Mar. 26, 2019

(65) Prior Publication Data

US 2020/0312061 A1    Oct. 1, 2020

(51) Int. Cl.
*G01R 31/3185* (2006.01)
*G05B 23/02* (2006.01)
(Continued)

(52) U.S. Cl.
CPC ....... *G01R 31/318519* (2013.01); *B64G 1/46* (2013.01); *G05B 23/0243* (2013.01);
(Continued)

(58) Field of Classification Search
CPC .......... G06F 30/34; G06F 11/142; G06F 8/34; H03K 19/0033; G01R 31/318519;
(Continued)

(56) References Cited

U.S. PATENT DOCUMENTS

RE45,388 E     2/2015  Wichowski et al.
9,444,376 B2   9/2016  Hansen et al.
(Continued)

FOREIGN PATENT DOCUMENTS

EP    3193223 A1    7/2017

OTHER PUBLICATIONS

Of "Life Support Systems, Sustaining Humans Beyond Earth", Jackson, NASA, Aug. 3, 2017 available at: https://www.nasa.gov/content/life-support-systems) (Year: 2017).*
(Continued)

*Primary Examiner* — Kenneth J Malkowski
(74) *Attorney, Agent, or Firm* — Cantor Colburn LLP

(57) ABSTRACT

Diagnosing whether controllers of internal vehicle systems are the source of failures detected by a system control managing a vehicle such as a spacecraft. Highspeed data is received via at a field programmable gate array (FPGA) embedded in an assembly of the vehicle. The FPGA includes a controller and a digital diagnostic interface. In one embodiment, the diagnostic interface utilizes Very Highspeed Integrated Circuit (VHSIC) Hardware Description Language (VHDL) for performance modeling of a controller configured to control at least one internal system within the vehicle. The VHDL performance models the controller. Upon receiving an indication of a failure, the performance modeling of the controller is used to ascertain whether or not the controller is the source of the failure. Disassembly of the assembly housing the internal system is not required in order to ascertain whether or not the controller is the source of the failure.

10 Claims, 4 Drawing Sheets

(51) Int. Cl.
    *G06F 8/34*     (2018.01)
    *G06F 11/14*     (2006.01)
    *B64G 1/46*     (2006.01)
    *B60W 50/02*     (2012.01)
    *G07C 5/08*     (2006.01)
    *B64G 1/52*     (2006.01)
    *B64G 1/54*     (2006.01)

(52) U.S. Cl.
    CPC .............. *G06F 8/34* (2013.01); *G06F 11/142* (2013.01); *B60W 50/0205* (2013.01); *B60W 2050/021* (2013.01); *B64G 1/52* (2013.01); *B64G 1/54* (2013.01); *G07C 5/0808* (2013.01); *G07C 5/0816* (2013.01)

(58) Field of Classification Search
    CPC ... B64G 1/46; B64G 1/54; B64G 1/52; G05B 23/0243; G07C 5/0808; G07C 5/0816
    See application file for complete search history.

(56) References Cited

U.S. PATENT DOCUMENTS

| | | |
|---|---|---|
| 9,836,221 B1 | 12/2017 | Edfors |
| 2004/0148069 A1* | 7/2004 | Marshall .............. G06F 11/142 |
| | | 701/13 |
| 2016/0107768 A1 | 4/2016 | Nicks et al. |
| 2017/0205794 A1* | 7/2017 | Wichowski ............. G06F 30/34 |
| 2018/0285192 A1* | 10/2018 | Merl ................... G06F 13/4063 |

OTHER PUBLICATIONS

European Search Report for Application No. 19210085.7, dated Jul. 10, 2020, 14 pages.

Odavic, et al. "Real-Time Fault Diagnostics for a Permanent Magnet Synchronous Motor Drive for Aerospace Applications" Energy Conversion Congress and Exposition (ECCE), 2010 IEEE, Sep. 12, 2010, 6 pages.

* cited by examiner

HIGHSPEED DATA INTERFACE FOR DISTRIBUTED SYSTEM MOTOR CONTROLLERS

BACKGROUND

The invention relates generally to controllers, and more particularly, to a highspeed interface for diagnosing whether the controllers are the source of detected failures.

Vehicles such as aircraft and spacecraft each incorporate numerous different systems that require testing and troubleshooting during manufacture and assembly. Because of economy of space, these systems are often deeply embedded within various assemblies that form the vehicle. For example, because access is limited due to the spacecraft's design, the system components are difficult to access when failures occur during testing. Moreover, the motors used in spacecraft assemblies are hardened in order to survive in a radiation environment. These motors that are deeply embedded within a vehicle assembly are the usual suspects when failures occur. Also, during system operation and testing, higher system constraints typically preclude various motor parameters from being included in telemetry at a rate that allows system anomalies to be sufficiently understood. Furthermore, disassembly of a vehicle assembly in order to remove a component creates cost and scheduling issues. Removal of a controller or its motor requires testing be repeated. What is needed, without interfering with system operations, is external access to all motor operational parameters including rapid collection of real time data that allows detailed analysis of motor operations.

SUMMARY

According to a non-limiting embodiment, a method for diagnosing a failure detected by a system control managing a vehicle is provided. The method includes receiving highspeed data at a field programmable gate array (FPGA) embedded in an assembly of the vehicle, the FPGA includes a controller and a digital diagnostic interface, the diagnostic interface configured for utilizing hardware description programming language for performance modeling of the controller, wherein the controller is configured to control at least one internal system of a plurality of internal systems within the vehicle. The method also includes modeling performance of the controller via the hardware description programming language while the controller drives functioning of the at least one internal system. The method further concludes receiving at the FPGA an indication of a failure from the system control of the vehicle and utilizing the performance modeling of the controller to ascertain whether or not the controller is a source of the failure.

According to another non-limiting embodiment, a FPGA is provided. The FPGA includes a controller and a digital diagnostic interface where the diagnostic interface utilizes Very Highspeed Integrated Circuit (VHSIC) Hardware Description Language (VHDL) for performance modeling of the controller. The controller is configured to control an internal system of a plurality of internal systems within a spacecraft and the VHDL models performance of the controller while the controller drives functioning of the internal system of the spacecraft. When the FPGA receives an indication of a failure from a system control of the spacecraft, the diagnostic interface utilizes the performance modeling of the controller to ascertain whether or not the controller is the source of the failure. An assembly of the spacecraft is free from being disassembled in order to ascertain whether or not the controller is the source of the failure.

According to yet another non-limiting embodiment a diagnostic interface for diagnosing a source of a failure is provided. The diagnostic interface is configured from a FPGA embedded in an assembly of a vehicle. The FPGA accesses real-time data from a controller and utilizes the real-time data with VHDL for performance modeling of the controller. The diagnostic interface utilizes the performance modeling of the controller to ascertain whether or not the controller is the source of the failure.

Additional features and advantages are realized through the techniques of the invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings, in which:

Figure 1:
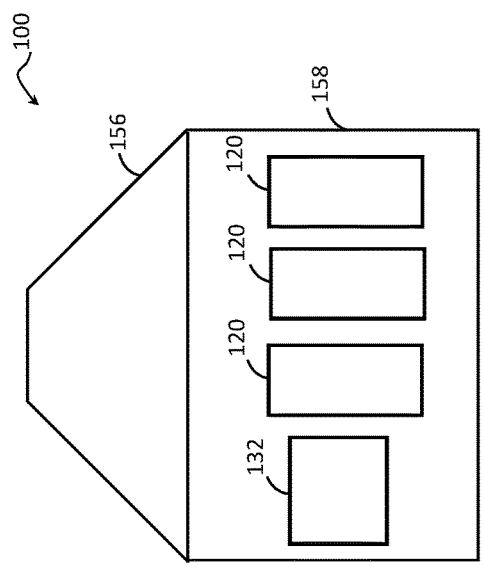
FIG. 1 depicts an exemplary embodiment of a spacecraft having a system control and a plurality of interior systems for a space environment according to one or more embodiments of the present disclosure.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. Accordingly, in the interest of brevity, many conventional implementation details are only mentioned briefly herein or are omitted entirely without providing the well-known system and/or process details.

Referring to FIG. 1, there is shown an embodiment illustrating a vehicle which may be any type of vehicle such as, for example, aircraft, spacecraft, space station, satellite, land vehicles and marine vehicles used while implementing the teachings herein. For explanation purposes, the vehicle is hereinafter simply referred to as a spacecraft 100. However, the teachings herein are not to be limited to only spacecraft.

In one or more embodiments, the spacecraft 100 is configured from multiple preconstructed assemblies such as assemblies 156, 158 shown in FIG. 1. Although the spacecraft 100 is depicted as having only the two assemblies 156, 158, any number of assemblies may be utilized to configure a vehicle such as the spacecraft 100. Each of the assemblies is manufactured to include one or more interior systems. For example, in FIG. 1 the assembly 158 includes interior systems 120. However, each assembly may have any number of interior systems 120. An interior system 120 can be, for example, a life support system, air revitalization system, pressure control system, and the like. Each system may include, for example, various subsystems depending on the intended function such as controllers, processors, fans, actuators, valves, regulators, motors, generators, heat exchangers, carbon dioxide removal systems, trace contaminant control, smoke detectors and the like. Depending on the type of vehicle, such as a spacecraft or space station, the interior systems and subsystems may be hardened against radiation so that they may function and survive within a radiation environment.

Figure 3:
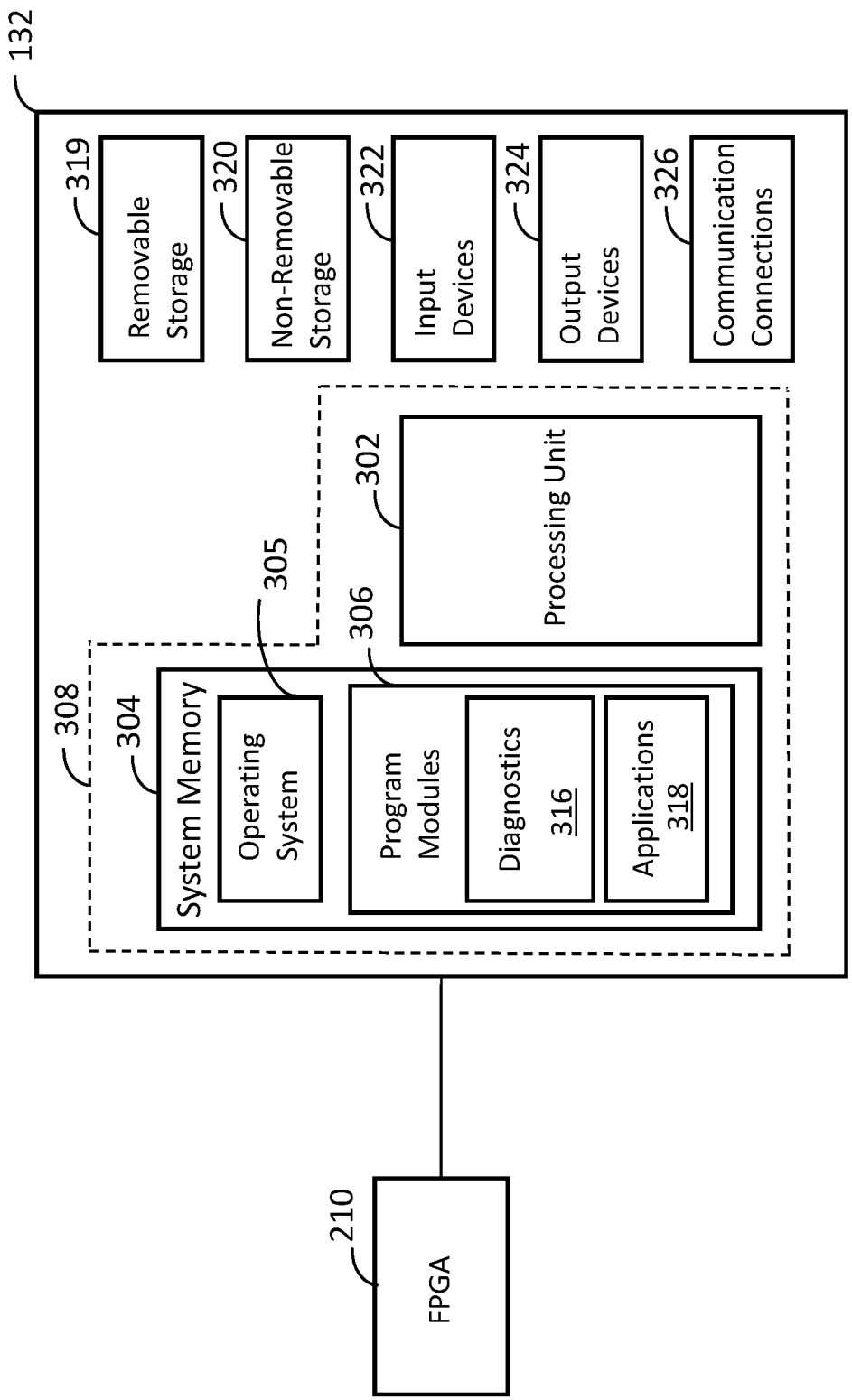
FIG. 3 depicts a block diagram illustrating an exemplary control system that may be utilized to implement one or more embodiments of the present invention.

Still referring to FIG. 1, the spacecraft 100 includes a system control 132 for monitoring and managing the operation and behavior of the spacecraft 100 as well as the interior systems 120. In particular, the system control 132 receives telemetry data from the spacecraft 100 which it uses to monitor the spacecraft's health. The telemetry data contains sampled data to provide information about its internal systems 120. The system control 132 is a computerized system similar to a general-purpose computing system that is radiation hardened and that is allocated with mission and internal system requirements which define the system control's operational modes and states. FIG. 3 illustrates an exemplary embodiment of the physical components (i.e., hardware) of the control system 132.

Figure 2:
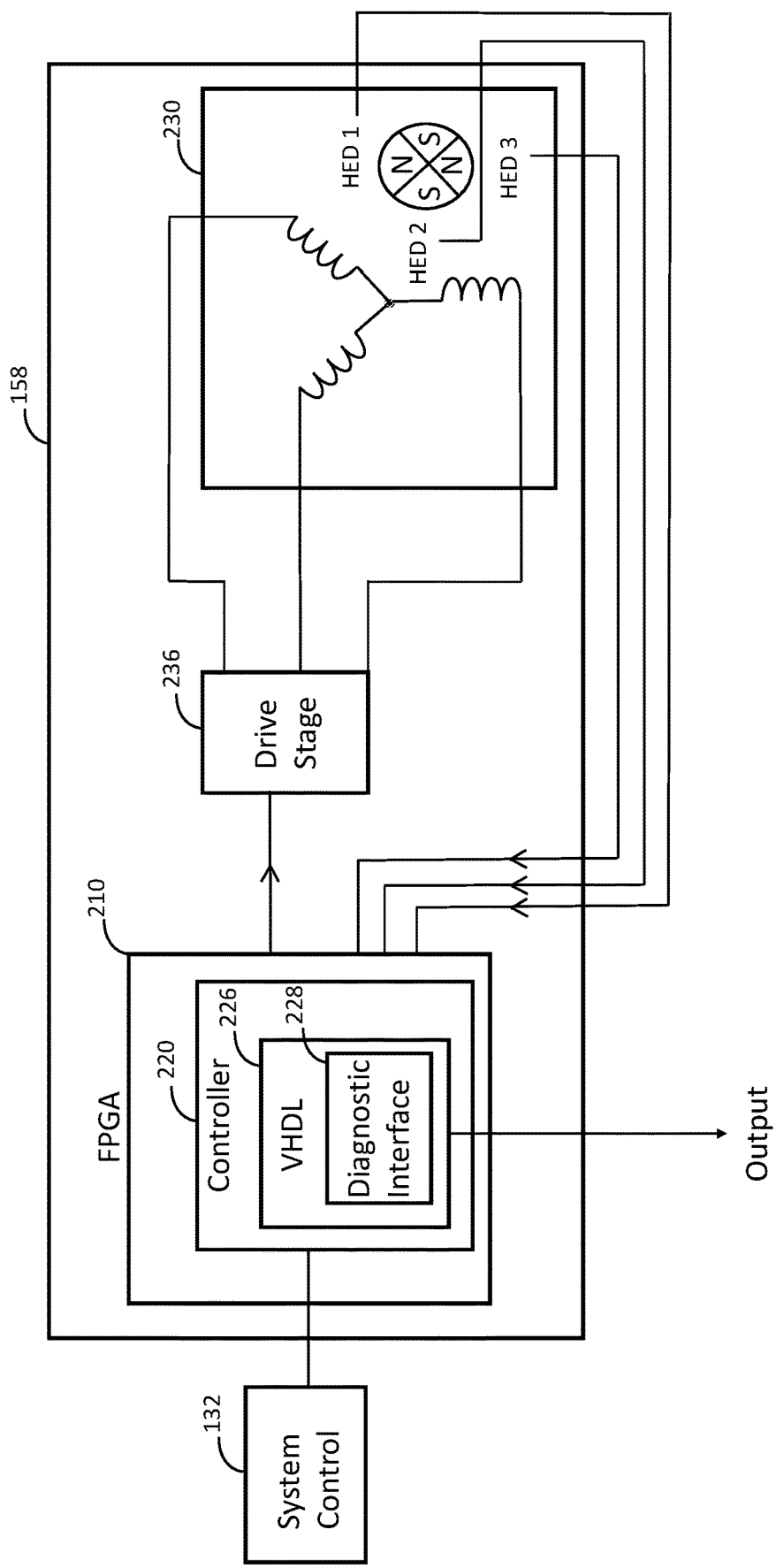
FIG. 2 depicts a field programmable gate array (FPGA) based diagnostic circuitry for a space environment according to one or more embodiments of the present invention.

FIG. 2 depicts a field programmable gate array (FPGA) based diagnostic circuitry for a space environment for implementing one or more embodiments of the teachings herein. An assembly 158 of a vehicle, for example the spacecraft 100, includes the FPGA 210. The FPGA 210 includes programable circuitry for providing one or more controllers 220. Each controller 220 is configured to control at least one internal system 120 such as, for example, the life support system within the space craft 100. Because of the FPGA 210, the data acquired from the internal system 120 is highspeed data including real-time data. In one or more embodiments, the highspeed data received by the FPGA 210 is at a rate that exceeds a data rate of the system control 132 of the spacecraft 100.

In the example of FIG. 2, both the FPGA 210 and an electric motor 230 are embedded within the assembly 158. The controller 220 controls the electric motor 230 for use with an HED pump of an internal system 120. In one or more embodiments, the motor 230 is driven by commands issued by a drive stage 236. The controller 220 includes a logic analyzer in the form of hardware description programming language such as, for example, Very Highspeed Integrated Circuit (VHSIC) Hardware Description Language (VHDL) for performing analytical performance modeling of the controller 220. The VHDL 226 provides a diagnostic interface 228 that utilizes the highspeed data to model the performance of the controller 220 to investigate potential failure modes and determine possible effects while the controller 220 drives the operation of the function of the internal system 120. In one or more embodiments, despite the internal system 120 and the corresponding one or more subsystems being radiation hardened, the diagnostic interface 228 allows external access to operational parameters of the radiation hardened subsystem.

In one or more embodiments, the controller 220 is interchangeable with another different controller 220, of the same FPGA 210 or some other FPGA of the same assembly 158, in order to control the same internal system 120 of the spacecraft 100. In such case, the modeling performance is then performed via the different controller 220. The controller 220 can be identified via the diagnostic interface 228 and then the identity of the controller 220 and the highspeed data from the controller 220, at a suitable data rate for the control system 132, can be provided to the system control 132.

In one or more embodiments, upon a failure being detected, for example a failure detected by the system control 132 of the spacecraft 100, the FPGA 210 receives an indication of the failure from the system control 132 of the spacecraft 100. Receipt of the indication of the failure then initiates the performance modeling by the VHDL 226. The FPGA 210 then utilizes the performance modeling of the controller 220 by the VHDL 226 to ascertain whether or not the controller 220 is the source of the indicated failure. In one or more embodiments, from within an environmentally hardened system, the highspeed output of the VHDL 226 includes ascertaining from the performance modeling of the controller 220 that the controller 220 is the source of the failure. Also, in one or more other embodiments, the output of the VHDL 226 includes ascertaining from the performance modeling of the controller 220 that the controller 220 is not the source of the failure. In either case, ascertaining whether or not the controller 220 is the source of the failure precludes disassembly of the assembly 158 in order to ascertain from the performance modeling whether or not the controller 220 is the source of the failure. In other words, utilizing the FPGA 210 with the VHDL 228 allows ascertaining whether or not the controller 220 is the source of the failure to be free from disassembly of the assembly 158 and the interior system 120 of the spacecraft 100. From within an environmentally hardened system, the output from the VHDL 226 also includes, for example, depending on the function of the interior system, the duty cycle of the motor, HED position, motor phase current, drive stage commands, motor speed, stall detection, and current limit density. The data is received and analyzed by the VHDL 226 to allow real-time external output for understanding detected failures and anomalies despite the controller 220 being embedded within an environmentally hardened system.

Referring to FIG. 3, an embodiment illustrating physical components of the control system 132 is shown. In a basic configuration, the control system 132 includes at least one processing unit 302 and a system memory 304. According to an aspect, depending on the configuration and type of control system 132, the system memory 304 comprises, but is not limited to, volatile storage (e.g., random access memory), non-volatile storage (e.g., read-only memory), flash memory, or any combination of such memories. According to an aspect, the system memory 304 includes an operating system 305 and one or more program modules 306 suitable for running software applications 318. According to an aspect, the system memory 304 includes a diagnostic module 316 for providing diagnostic information via a diagnostic interface of the FPGA 210. The operating system 305, for example, is suitable for controlling the operation of the control system 132. In one or more embodiments, diagnostics module 316 can initiate via the FPGA 210 performance modeling of the functioning of one or more interior systems 140. Moreover, upon the diagnostics module 316 detecting a failure, the system control 132 can issue a notification to the FPGA 210 indicating the failure.

Furthermore, aspects are practiced in conjunction with a graphics library, other operating systems, or any other application program, and is not limited to any particular application or system. This basic configuration is illustrated in FIG. 3 by those components within a dashed line 308. According to an aspect, the control system 132 has additional features or functionality. For example, according to an aspect, the control system 132 includes additional data storage devices (removable and/or non-removable) such as, for example, magnetic disks, optical disks, or tape. Such additional storage is illustrated in FIG. 3 by a removable storage device 319 and a non-removable storage device 320.

As stated above, according to an aspect, a number of program modules and data files are stored in the system memory 304. While executing on the processing unit 302, the program modules 306 (e.g., diagnostics module 316) perform processes including, but not limited to, one or more of the stages or steps of the method 400 illustrated in FIG. 4. According to an aspect, other program modules are also used.

According to an aspect, the control system 132 has one or more input device(s) 322 such as a keyboard, a mouse, a pen, a sound input device, a touch input device, etc. In one or more embodiments, the input device may be a recorder receiving a video feed from one or more video cameras. The output device(s) 324 such as a display, speakers, a printer, etc. are also included according to an aspect. The aforementioned devices are examples and others may be used. According to an aspect, the control system 132 includes one or more communication connections 326 allowing communications with ground control and other computing devices. Examples of suitable communication connections 326 include, but are not limited to, radio frequency (RF) transmitter, receiver, and/or transceiver circuitry; universal serial bus (USB), parallel, and/or serial ports.

Figure 4:
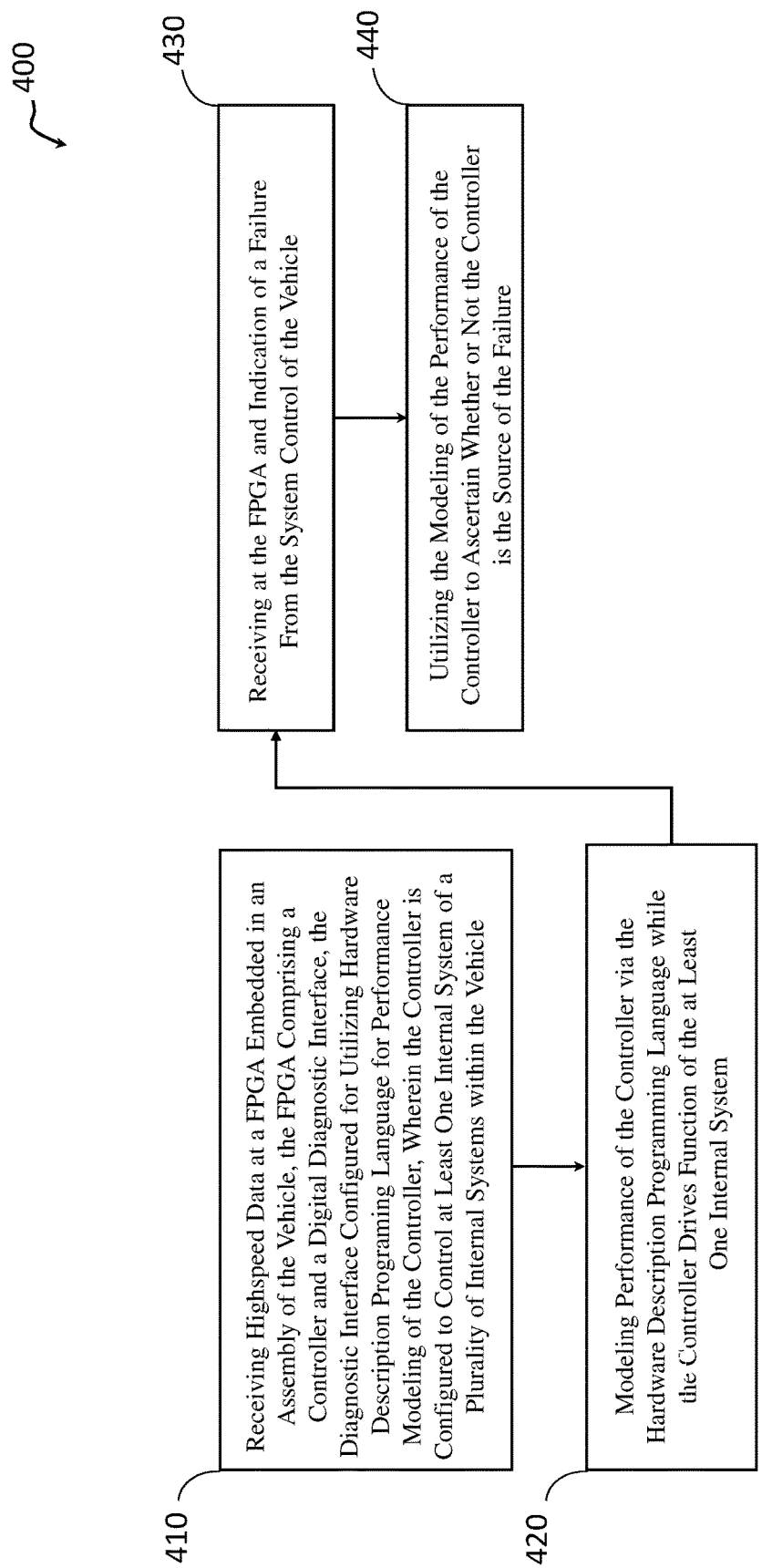
FIG. 4 is a flow diagram illustrating a method of diagnosing a failure detected by a system control managing a vehicle according to one or more embodiments of the present invention.

Turning to FIG. 4, one or more embodiments may include a method 400 for diagnosing a failure detected by a system control managing a vehicle. The flow diagram of FIG. 4 illustrates the method 400 that includes process block 410 for receiving highspeed data at a FPGA embedded in an assembly of the vehicle, the FPGA comprising a controller and a digital diagnostic interface, the diagnostic interface configured for utilizing hardware description programming language for performance modeling of the controller, wherein the controller is configured to control at least one internal system of a plurality of internal systems within the vehicle. The method 400 also includes process block 420 for modeling performance of the controller via the hardware description programming language while the controller drives functioning of the at least one internal system. Also, the method 400 includes process block 430 for receiving at the FPGA an indication of a failure from the system control of the vehicle and process block 440 for utilizing the performance modeling of the controller to ascertain whether or not the controller is a source of the failure.

In one or more embodiments, the method 400 may also include where receiving highspeed data includes receiving high speed data at a rate that exceeds a data rate of the system control of the vehicle. The method 400 may also include where receiving highspeed data includes receiving real-time data. The method 400 can include ascertaining from the performance modeling of the controller that the controller is not the source of the failure. Also, the method 400 can include precluding disassembly of the assembly in order to ascertain from the performance modeling of the controller whether or not the controller is the source of the failure and the controller controlling a motor of the at least one internal system within the assembly of the vehicle. The method 400 may also include the diagnostic interface providing to the system control identification of the controller and access to the highspeed data from the controller. The method 400 can include where the vehicle is a spacecraft and the internal systems within the spacecraft are hardened against a radiation environment and where at least one internal system of the assembly of the spacecraft is a life support system. The method 400 may also include where the hardware description programming language is VHDL. The method 400 can also include interchanging the controller with another different controller configured to control the same at least one internal system of the vehicle.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for diagnosing a failure detected by a system control managing a vehicle, the method comprising:
   receiving highspeed data at a field programmable gate array (FPGA) embedded in an assembly of the vehicle, the FPGA comprising a controller and a digital diagnostic interface, the digital diagnostic interface configured for utilizing hardware description programming language for performance modeling of the controller, wherein the controller is configured to control at least one internal system of a plurality of internal systems within the vehicle, and wherein receiving highspeed data comprises receiving high speed data at a rate that exceeds a data rate of the system control of the vehicle;
   modeling performance of the controller via the hardware description programming language while the controller drives functioning of the at least one internal system;
   receiving at the FPGA an indication of a failure from the system control of the vehicle; and
   utilizing the performance modeling of the controller to ascertain whether or not the controller is a source of the failure.

2. The method of claim 1 wherein receiving highspeed data further comprises receiving real-time data.

3. The method of claim 1 further comprising ascertaining from the performance modeling of the controller that the controller is not the source of the failure.

4. The method of claim 3 further comprising preventing disassembly of the assembly in order to ascertain from the performance modeling of the controller whether or not the controller is the source of the failure.

5. The method of claim 1 further comprising the controller controlling a motor of the at least one internal system within the assembly of the vehicle.

6. The method of claim 1 further comprising the diagnostic interface providing to the system control identification of the controller and access to the highspeed data from the controller.

7. The method of claim 1 wherein the at least one internal system of the assembly of the vehicle is a life support system for the vehicle.

8. The method of claim 1 wherein the hardware description programming language is Very Highspeed Integrated Circuit (VHSIC) Hardware Description Language (VHDL).

9. The method of claim 1 further comprising interchanging the controller with another different controller configured to control the same at least one internal system of the vehicle.

10. The method of claim 1 wherein the vehicle is a spacecraft and the internal systems within the spacecraft are hardened against a radiation environment.

* * * * *